United States Patent [19]

Chung

[11] Patent Number: 4,894,560
[45] Date of Patent: Jan. 16, 1990

[54] DUAL-SLOPE WAVEFORM GENERATION CIRCUIT

[75] Inventor: Hyung-Sub Chung, Seoul, Rep. of Korea

[73] Assignee: Samsung Semiconductor and Telecommunications Co. Ltd., Gumi, Rep. of Korea

[21] Appl. No.: 247,048

[22] Filed: Sep. 16, 1988

[30] Foreign Application Priority Data

Dec. 8, 1987 [KR] Rep. of Korea .................... 87-14053

[51] Int. Cl.[4] ........................ H03K 5/12; H03K 17/16
[52] U.S. Cl. .................................. 307/263; 307/443; 307/451; 307/279
[58] Field of Search ............... 307/443, 451, 263, 264, 307/279, 475

[56] References Cited

U.S. PATENT DOCUMENTS 4,543,494  9/1985  Wakimoto ........................... 307/443
4,571,504  2/1986  Iwamoto et al. .................... 307/443

Primary Examiner—Stanley D. Miller
Assistant Examiner—Timothy P. Callahan
Attorney, Agent, or Firm—Ladas & Parry

[57] ABSTRACT

A dual-slope waveform generation circuit without a DC path and with decreased layout area including a pull-up and pull-down resistor, a transmission gate and an inverter. An input signal IN is applied to the pull-up transistor, to each gates of MOS transistors $M_1$, $M_2$ composing of the inverter A, and to drains of MOS transistors $M_3$, $M_4$ composing of the transmission gate B. A common node in the inverter is connected to the gate of the N type MOS transistor in the transmission gate. The sources of the transistors $M_3$, $M_4$ are connected to the gate of the pull-down transistor. An output signal OUT is applied to the gate of the transistor $M_4$ and the signal is fed back.

3 Claims, 4 Drawing Sheets

DUAL-SLOPE WAVEFORM GENERATION CIRCUIT

BACKGROUND OF THE INVENTION

This invention relates to a dual-slope waveform generation circuit for a driver circuit of memory sense amplifiers, and more particularly to a dual-slope waveform generation circuit which uses a time interval of gate input signals of pull-up and pull-down transistors Generally, a dual-slope waveform generation circuit uses the time interval of two input signals with a same phase. These two input signals, as shown in FIG. 5, provide a dual-slope with an output signal by turning on transistors $M_6$ and $M_7$ sequencely. That is, when an input signal IN changes from a low level to a high level, transistor $M_6$ becomes on by an input signal $IN_a$ so that the first slope is provided with an output signal $OUT_c$, and transistor $M_7$ becomes on by an input signal $IN_b$ which has the same phase with said input signal $IN_a$ and a time interval about said input signal $IN_a$ so that the second slope is provided with the output signal $OUT_c$. In case that the time interval of said input signals $IN_a$ and $IN_b$ is opposite, the output signal still has the dual-slope as described above. On the other hand, there is another dual-slope waveform generation circuit which uses a DC path, as shown in FIG. 6.

In FIG. 6, the first input signal $IN_b$ turns on the transistors $M_8$, $M_9$ so that the first slope proportioned to the resistor ratio of said transistors $M_8$, $M_9$ is provided with an output signal, and an input signal $IN_a$ which has a time interval with the input signal $IN_b$ turns on transistor $M_6$ so that the second slope is provided with an output signal.

In the conventional dual-slope waveform generation circuit, as described above, a delay circuit for a time interval of input signals with same phases is required, thus there is a problem that lay out area incrases when a circuit is designed. In the case of using resistor components for the time delay particularly, the increment of layout area becomes the important problem. And in the case of using a DC path, unnecessary power is consumed by the increment of operating current.

SUMMARY OF THE INVENTION

An object of this invention is to provide a dual-slope waveform generation circuit in which unnecessary power waste due to the formation of a DC path is prevented when the circuit operates, and layout area decrease when the circuit is integrated.

The present invention is characterized by a dual-slope waveform generation circuit in which an input signal is applied directly to the gate of a pull-up transistor or a pull-down transistor through a transmission gate, and said transmission gate is sequentially and respectively controlled by a delayed and inverted (opposite -phase) input signal through a inverter and an output feedback signal, so that the first slope is provided with an output signal by the delayed and inverted input signal and the second slope is provided with the output signal by the output feedback signal.

DETAILED DESCRIPTION OF SPECIFIC INVENTION

Figure 1:
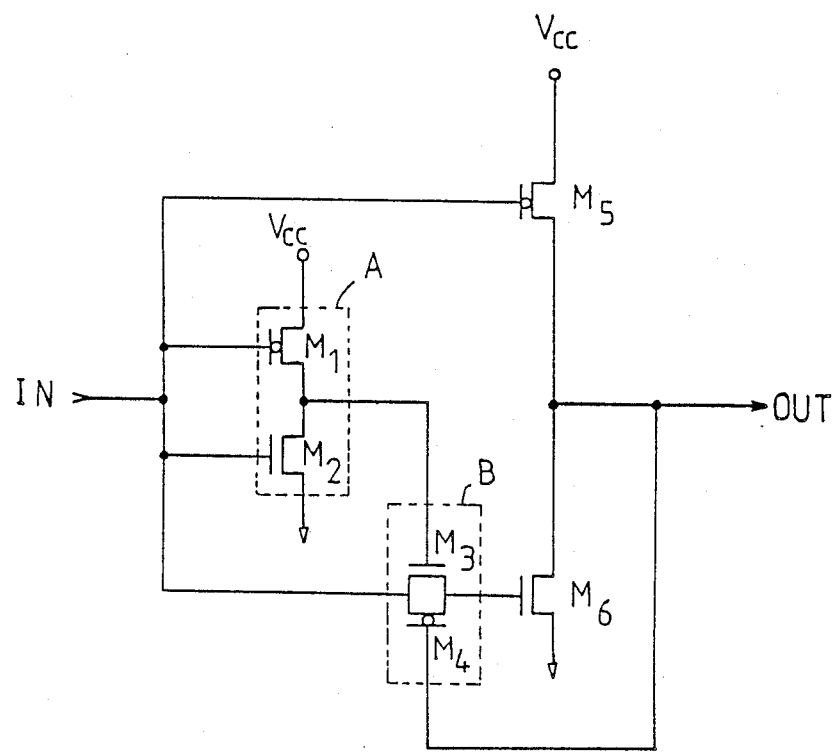
FIG. 1 is a circuit diagram according to one embodiment of the present invention.

FIG. 1 shows a circuit diagram in accordance with one embodiment of the invention. In FIG. 1, an input signal IN is applied directly to the gate of a pull-up PMOS transistor $M_5$, whereas the input signal is applied to the gate of a pull-down NMOS transistor $M_6$ through a transmission gate B. The transmission gate B is connected to be controlled by a delayed and inverted input signal IN through a inverter A, and an output feedback signal OUT. Said inverter for obtaining the delayed and opposite-phase(inverted) input signal is composed of PMOS and NMOS transistors $M_5$, $M_6$, and said transmission gate B is composed of parallel connected with PMOS and NMOS transistors $M_3$, $M_4$. The delayed and inverted input signal IN by inverter A and the output feedback signal OUT are applied to gates of PMOS and NMOS transistors in transmission gate B.

Figure 2:
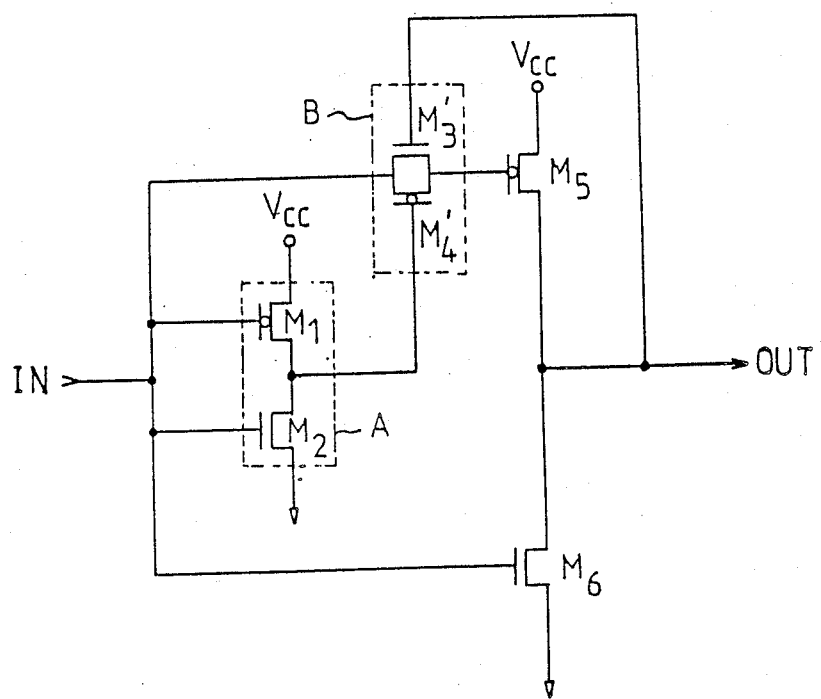
FIG. 2 is a circuit diagram according to another embodiment of the present invention.

FIG. 2 shows another embodiment of the invention.

In FIG. 2, a transmission gate B is connected to the gate of the pull up transistors $M_5$ Gates of PMOS and NMOS transistors $M'_4$, $M'_3$ composed of a transmission gate B are connected to be controlled by a signal through inverter A and an output feedback signal OUT.

The operation of the present invention is as follows.

Figure 3:
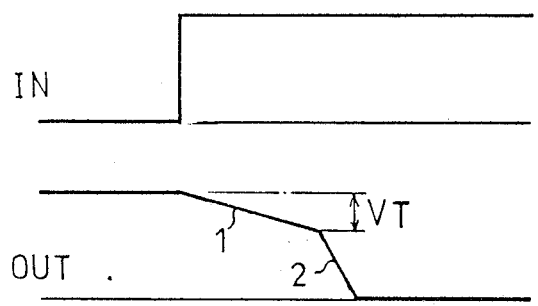
FIG. 3 is a waveform diagram of input/output signals of FIG. 1.

In FIG. 1, when an input signal IN goes from a low level to a high level, the pull-up transistor $M_5$ turns off, and the input signal with high level is applied to the gate of the NMOS transistor $M_3$ during the delay time of the input signal by the inverter A. Thus the charge is accumulated at the gate of the pull-down transistor $M_6$. By this charge, said pull-down transistor $M_6$ turns on so that the charge of a driver output node discharges slowly. At this time, an output signal, as shown in FIG. 3, has the first slope 1. After that, when the level of the output signal OUT decreases from the level of the input signal IN to the level dropped as much as a threshold voltage $V_T$ of the PMOS transistor $M_4$ in the transmission gate B, by the discharge of the driver outout terminal, the PMOS transistor $M_4$ turns on. Thus the pull down transistor $M_6$ turns on fully so that the remained charge of the driver output node discharges fastly. Therefore the output signal OUT has the second slope 2 as shown in FIG. 3.

Figure 4:
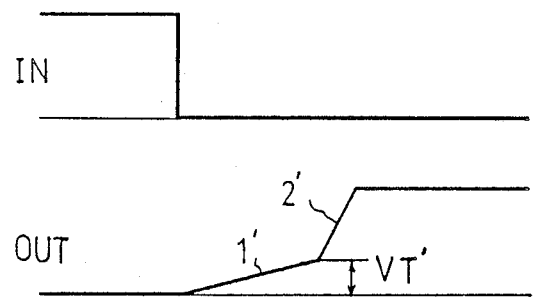
FIG. 4 is a waveform diagram of input/output signals of FIG. 2, and FIG. 5 and FIG. 6 are the prior circuit diagrams.
Figure 5:
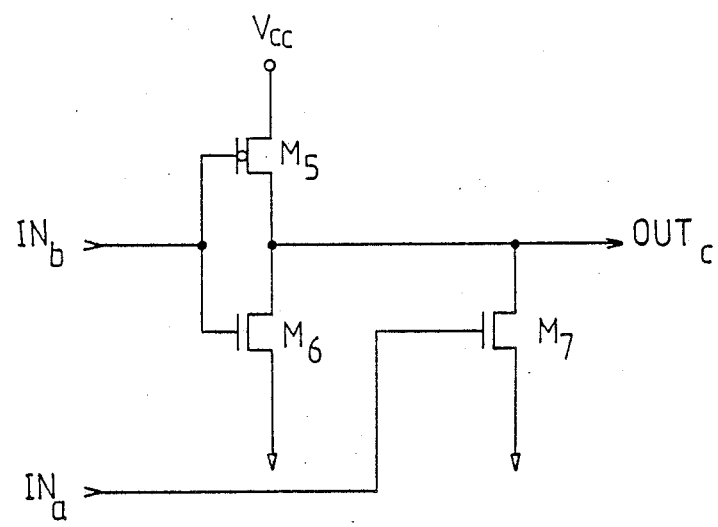
Figure 6:
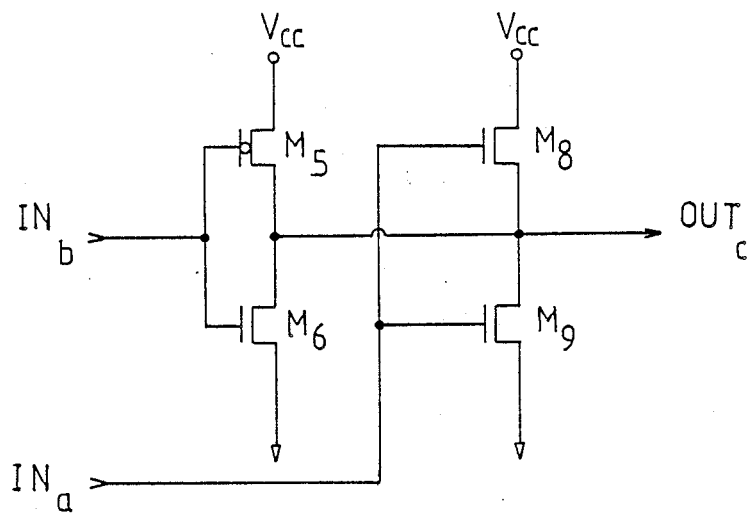

In FIG. 2 illustrating another embodiment of the invention, when an input signal goes from a high level to a low level, an output signal OUT has a dual-slope. That is when an input signal IN goes to a low level, the pull-down transistor $M_6$ turns off, the input signal with a low level is applied to the gate of the PMOS transistor $M'_4$ in the transmission gate B during the delay time of the input signal by the inverter A. Thus, the accumulated charge in the gate of the pull up transistor $M_5$ discharges toward the input node, and said pull-up transistor $M_5$ turns on slowly, and the magnitude of charge in the driver output node by a supply voltage $V_{CC}$ increases slowly as shown in FIG. 4. At this time the output signal obtains the first slope 1'. By the increment of the charge of driver output node, when the level of the output signal OUT goes to a level increases as much as a threshold voltage $V'_T$ of the NMOS transistor $M'_3$, the NMOS transistor $M'_3$ in transmission gate B turns on. Thus the charge of the gate of said pull-up transistor M$_5$ discharges fastly, so that the output signal OUT of the driver output node goes to a V$_{CC}$ level with the fast slope 2' as shown in FIG. 4.

The above embodiment is given by way of example only and variours modifications will be apparent to persons skilled in the art without departing from the scope of the invention defined by the appended claims. For example, the fact that the transmission gate is placed at the gates of the pull-up or pull-down transistors, and the transmission gate can be controlled by any means for delaying and inverting phase of input signal and by any means for the feedback of the output signal will be obvious to person skilled in the art.

As described above, according to the dual-slope waveform generation circuit of the present invention, unnecessary power waste is prevented by the exception of a DC path when the circuit operates; and there is a special effect that layout area is reduced according to the simplicity of the circuit configuration without another delay circuit.

The invention is in no way limited to the example described hereinabove. Various modifications of the disclosed embodiment, as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. A dual-slope waveform generation circuit comprising:

a pull-up transistor and a pull-down transistor connected in series with each other, one of said pull-up and pull-down transistors being directly connected to an input signal node, the other of said pull-down and pull-up transistors being connected to the sources of a pair of parallel connected P and N type MOS transistors forming a transmission gate, and a terminal interconnecting said pull-up and pull-down transistors being connected to an output signal node, said transmission gate being controlled sequentially by, first, a delayed and inverted input signal generated by an inverter and, second, an output feedback signal, the drains of said P and N type MOS transistors of said transmission gate being connected to the input signal node; and the invertor being composed of P and N type MOS transistors connected in series with each other, gates of said P and N type MOS transistors being connected to the input signal node, a source of said P type MOS transistor and a drain of said N type MOS transistor being connected together at an inverter output node, said inverter output node being connected to said transmission gate for controlling the transmission through one of the transistors thereof, a source of said N type MOS transistor of said inverter being connected to ground, and said output signal node being connected to and controlling the transmission through the other of said transmission gate transistors.

2. A dual-slope waveform generation circuit as claimed in claim 1, where, in said transmission gate, a gate of said one transistor is connected to said inverter output node for input of said delayed and inverted input signal from said inverter, and a gate of said other MOS transistor of said transmission gate is connected to said output signal node.

3. A dual-slope waveform generating circuit using a pull-up transistor and a pull-down transistor connected in series;

a transmission gate composed of a PMOS fourth (M$_4$) transistor and an NMOS third transistor (M$_3$) connected in parallel, the source terminals of which are connected with a gate terminal of one of said pull-up and pull-down transistors;

an inverter composed of a PMOS first transistor (M$_1$) and a series-connected NMOS second transistor (M$_2$), a source terminal of said first transistor and a drain terminal of said second transistor being connected with each other and with the gate terminal of one of said third and fourth transistors of said transmission gate, and a source terminal of said second transistors being connected with ground;

an input signal node (IN) connected with, respectively, the gate terminal of the other of said pull-up and pull-down transistors, the gate terminals of said first and said transistors of said inverter, and with the drain terminals of said third and fourth transistors of said transmission gate; and an output node (out) connected with the gate terminal of the other of said third and fourth transistors of said transmission gate and with the common terminals of said pull-up and pull-down transistors; whereby an input signal at said input signal node is transferred to the gate terminal of said other of said pull-up and pull-down transistors thereby making said one transistor operate first by transmission of gate signal thereto via said one of said third and fourth transistors to change the signal at the output node at a first rate and then, after the output signal reaches a threshold level fed back to turn on the other of said third and fourth transistors, to operate said one transistor by transmission of gate signal thereto through said other of said third and fourth transistors for changing the signal at the outputs node at a second rate faster than said first rate.

* * * * *